(12) United States Patent
Burberry et al.

(10) Patent No.: US 7,989,146 B2
(45) Date of Patent: Aug. 2, 2011

(54) COMPONENT FABRICATION USING THERMAL RESIST MATERIALS

(75) Inventors: Mitchell S. Burberry, Webster, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 928 days.

(21) Appl. No.: 11/869,008

(22) Filed: Oct. 9, 2007

(65) Prior Publication Data

US 2009/0092928 A1 Apr. 9, 2009

(51) Int. Cl.
*G03F 7/26* (2006.01)
(52) U.S. Cl. ............... 430/314; 430/329; 430/311
(58) Field of Classification Search .......... 430/314, 430/311, 313
See application file for complete search history.

(56) References Cited

U.S. PATENT DOCUMENTS

| | | | |
|---|---|---|---|
| 5,017,459 A * | 5/1991 | McColgin | 430/299 |
| 5,360,698 A * | 11/1994 | Hanrahan | 430/324 |
| 6,352,814 B1 | 3/2002 | McCullough et al. | |
| 6,387,597 B1 * | 5/2002 | Gelbart | 430/311 |
| 6,423,456 B1 | 7/2002 | Kitson et al. | |
| 6,541,181 B1 * | 4/2003 | Levanon et al. | 430/275.1 |
| 6,890,447 B2 * | 5/2005 | Natsume et al. | 216/12 |
| 2002/0094484 A1 * | 7/2002 | Buchsbaum et al. | 430/7 |
| 2004/0114652 A1 * | 6/2004 | Yoshikawa | 372/46 |
| 2006/0240232 A1 * | 10/2006 | Faris | 428/212 |
| 2007/0077511 A1 * | 4/2007 | Tredwell et al. | 430/201 |

FOREIGN PATENT DOCUMENTS

| | | | |
|---|---|---|---|
| TW | 345699 | * | 11/1998 |
| WO | 97/39894 | | 10/1997 |

* cited by examiner

*Primary Examiner* — Kathleen Duda
*Assistant Examiner* — Caleen O Sullivan
(74) *Attorney, Agent, or Firm* — Nelson Adrian Bush

(57) ABSTRACT

A method for producing a patterned material for electronic or photonic circuits, comprising the steps of:
p) providing a substrate;
q) coating the substrate with a polymer layer;
r) coating a thermal resist solution over the polymer layer to form a thermal resist layer, wherein the polymer layer is substantially immiscible in the thermal resist solution;
s) exposing predetermined areas of the thermal resist layer, corresponding to a desired image pattern, using infrared light;
t) removing portions of the thermal resist layer corresponding to a desired image pattern, using a developer;
u) removing the polymer layer where the thermal resist layer has been previously removed and undercutting a portion of the remaining thermal resist layer by an etching process;
v) depositing a material using a substantially anisotropic process; and removing the remaining thermal resist layer and any overlying material with a solvent for the polymer or thermal resist layers leaving the material in a desired pattern.

15 Claims, 7 Drawing Sheets

COMPONENT FABRICATION USING THERMAL RESIST MATERIALS

FIELD OF THE INVENTION

This invention generally relates to fabrication of electronic and photonic circuits and more particularly relates to methods for component fabrication using thermal resist materials.

BACKGROUND OF THE INVENTION

Photoresist technology and materials are conventionally used for forming patterns of conductive, semi-conductive, or insulating materials on a substrate in fabrication of devices such as electronic components, integrated circuits, small-scale photonic components, printed circuit boards, and interconnecting components for such devices. Using conventional photoresist materials and methods, a photoresist layer is overlaid and patterned onto a substrate or onto other patterned materials so that it either protects or exposes underlying material for an etching process that follows. The photoresist layer is normally formed of a polymeric, organic material that is substantially unaffected by a metal deposition or metal removal process and, accordingly, protects underlying areas from etching processes. A pattern is formed by imagewise exposing the photoresist material to actinic radiation through a mask or using a photographic image, such as a glass master, similar to photolithographic techniques. The exposing radiation, generally in the UV, X-ray, or electron beam domain, causes a chemical reaction in the photoresist material, affecting its relative solubility accordingly.

Photosensitive materials and compositions can be either positive-acting (that is, photosolubilizable) or negative-acting (that is, photoinsolubilizable or photocrosslinkable). Positive-working (photo) sensitive compositions are rendered soluble by actinic radiation (deep-near UV, x-ray or electron-beam) and can be removed using selective developing solutions leaving unexposed areas intact. Negative-working (photo)sensitive compositions are those which become insoluble upon exposure to actinic radiation. Selected solutions can dissolve and remove the unexposed areas of the composition while leaving the exposed portions intact. Development of such exposed materials yields negative tone images.

In general, the use of photosensitive materials for patterning is familiar to those skilled in the device fabrication arts, and years of research and development have helped to exploit photosensitive materials for a wide range of fabrication uses and to improve and refine various techniques for multi-layer device patterning using these materials.

In general, photoresist materials and techniques have been successfully applied for fabrication of a number of different types of components, however, these materials have some significant disadvantages and shortcomings. Conventional UV photoresist etching is a relatively costly process, requiring relatively high-energy radiation sources to drive the needed chemical reactions. Preparation of masks and phototools can be very expensive, error-prone, and time-consuming. The use of masking techniques is necessarily resolution-limiting and places considerable demands on the design of supporting optical components.

In attempts to improve upon the expense and complexity of conventional photoresist etching, a number of alternative fabrication techniques have been adapted. For example, the technology of ablation, which is the art of completely vaporizing a coating from a substrate, is a competing technology to photoresist etching. However, ablation is known to be a poor performer for complex patterning situations that require multiple layers. Repeated ablation cycles tend to degrade and debris from the impacted etching must be collected, since loose debris can be a serious problem for clean room environments.

Another competing technology to conventional photoresist employs a transfer mask. With this method, a donor sheet is used to transfer material from a substrate. The transfer mask has the advantage that loose debris is well contained. However, if the transferred material remains in contact with the substrate, tearing can occur at edges. Standoffs are sometime used to keep the transferred material from the substrate. However, when standoffs are employed loss of resolution may result and the standoffs themselves may attribute to shadowing upon the image.

Unlike photoresist substances that undergo chemical changes in reaction to light of high-energy, thermal resist materials undergo chemical or physical reactions in response to heat energy. Depending on the type of thermal resist material, the response to heat energy may take the form of ablation, or increased or decreased solubility in a particular developer, for example. In general, thermal resist materials are advantaged over photoresists by simpler chemistry, lower cost, and relative insensitivity to ambient light. Thermal resists are suitable for clean room environments where electronic circuits are manufactured.

Exemplary thermal sensitive materials and methods have been used for lithographic plate imaging, as described in International Patent Application WO 97/39894 entitled, "Heat-Sensitive Composition and Method of Making a Lithographic Printing Form with it" by Parsons et al. Thermal resist materials have also been proposed for use in electronic component manufacture, as disclosed in U.S. Pat. No. 6,423,456 entitled, "Method for Manufacture of Electronic Parts" to Kitson et al. and in U.S. Pat. No. 6,352,814 entitled, "Method of Forming a Desired Pattern" to McCullough et al.

Recent development of powerful, yet inexpensive infrared (IR) lasers has made them increasingly attractive for use in patterning by maskless lithography methods that use thermal resist materials. IR lasers provide a thermal solution that is advantaged over the heretofore-conventional photoresist etching. The use of lower cost IR laser sources with thermal resist materials in maskless lithography offers promise for dramatically reducing the cost and complexity of device fabrication as compared to conventional UV sources with photoresist materials. Maskless lithography is particularly advantaged over conventional mask-based techniques, especially with flexible substrates, large substrates, or surfaces that may not be perfectly planar.

However, a number of practical considerations remain. For example, while some inherent advantages over photoresist may be acknowledged by those skilled in the fabrication arts, further improvements in cost and performance would be needed to overcome reluctance to change from conventional photoresists to thermal resist materials and methods that are not as well known and to motivate fabricators to adapt their working methods to this alternative solution.

SUMMARY OF THE INVENTION

It is an object of the present invention to provide a method for producing a patterned material for electronic or photonic circuits, comprising the steps of:
 a) providing a substrate;
 b) coating the substrate with a polymer layer;

c) coating a thermal resist solution over the polymer layer to form a thermal resist layer, wherein the polymer layer is substantially immiscible in the thermal resist solution;

d) exposing predetermined areas of the thermal resist layer, corresponding to a desired image pattern, using infrared light;

e) removing portions of the thermal resist layer corresponding to a desired image pattern, using a developer;

f) removing the polymer layer where the thermal resist layer has been previously removed and undercutting a portion of the remaining thermal resist layer by an etching process;

g) depositing a material using a substantially anisotropic process; and h) removing the remaining thermal resist layer and any overlying material with a solvent for the polymer or thermal resist layers leaving the material in a desired pattern.

It is a feature of the present invention that it provides a maskless lithography method for component fabrication using thermal resist materials and methods, with lower cost IR laser light sources.

It is an advantage of the present invention that it harnesses chemistry and exposure techniques originally developed for use in preparing lithographic printing materials. The method of the present invention can provide a lower cost alternative to electronic component fabrication that is advantaged over methods that use photoresist materials.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figure 1A:
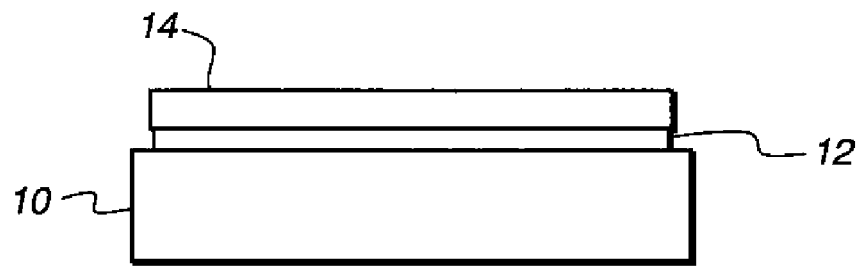
FIGS. 1A, 1B, 1C, and 1D show the sequence of steps used for forming a gate electrode when using thermal resist materials and an etching process.

The present description is directed in particular to elements forming part of, or cooperating more directly with, apparatus in accordance with the invention. It is to be understood that elements not specifically shown or described may take various forms well known to those skilled in the art.

Figures included as part of this application are provided for the purpose of illustrating important processes and components of the present invention and are not intended to accurately represent true size or scale. Moreover, components that are shown are simplified from those typically formed in practice, again with the intent of describing the method of the present invention.

Process Steps for Forming a FE-TFT

The process steps in the following example are used to form a portion of a Field-Effect Thin-Film Transistor (FE-TFT) device in one embodiment. The various steps building up each element of the transistor using etching are shown in FIGS. 1A through 2D.

Basic process steps are as follows:

(a) Gate electrode formation. Beginning with FIGS. 1A and 1B, a first sequence of procedures forms a gate electrode 20 for the transistor. A substrate 10 is coated with a metal layer 12. Substrate 10 can be a rigid material such as glass or metal, or may be a flexible material such as a plastic or metal sheet, typically mounted on a carrier that holds the flexible substrate in place temporarily during fabrication. In one embodiment, thin metal layer 12 is molybdenum, with a thickness of about 800 Angstroms; other metals or conductive materials at the same or other thickness could alternately be used.

A thermal resist layer 14 is coated onto metal layer 12. Thermal resist layer 14 is then baked for a sufficient time and temperature so that it becomes substantially insoluble in a developer. In one embodiment, baking temperature is 155 degrees C for about 5 minutes. Thermal resist layer 14 can include any of a number of types of resins or other substances optimized for IR light absorption and exposure discrimination. Exemplary materials include various types of active polymers that may include hydroxy, carboxylic acid, amino, amide and maleiimide functional groups.

A wide range of polymeric materials are suitable for use as thermal resist layer 14 in the present invention, examples of which include phenolic resins; copolymers of 4-hydroxystyrene, for example with 3-methyl-4-hydroxystyrene or 4-methoxystyrene; copolymers of (meth)acrylic acid, for example with styrene; copolymers of maleiimide, for example with styrene; hydroxy or carboxy functionalised celluloses; copolymers of maleic anhydride, for example with styrene; partially hydrolysed polymers of maleic anhydride.

Most preferably the active polymer is a phenolic resin. Particularly useful phenolic resins may include condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation, a range of phenolic materials with varying structures and properties can be formed. Particularly useful in this invention are novolak resins, resole resins and novolak/resole resin mixtures. Additional radiation-absorbing compounds may also be included in the composition of thermal resist layer 14, helping to increase or otherwise condition the heat-sensitivity and response of the active polymer composition.

Figure 1B:
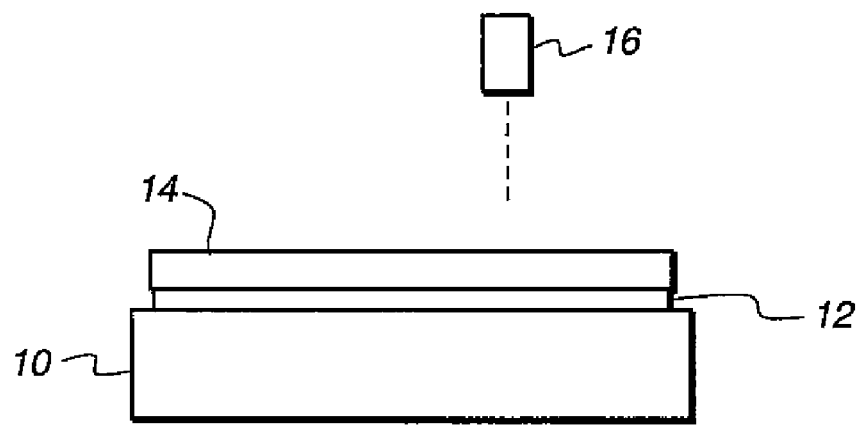

Next, as shown in FIG. 1B, the baked thermal resist layer 14 is patterned using infrared (IR) radiation directed from a laser 16. This patterning selectively alters the relative solubility of thermal resist layer 14 to a developer solvent. Depending on the material composition, thermal resist material may be negative- or positive-working. Negative-working materials are those that exhibit greater solubility in unexposed regions. Positive-working materials exhibit greater solubility where exposed. The examples described herein are positive-working.

The exposed irradiated surface, shown in FIG. 1B, is treated with a developer solution that acts as a solvent for the unwanted portions of thermal resist layer 14. The specific formulation for the aqueous developer composition depends on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates. Preferably, the aqueous developer is an alkaline developer containing inorganic or organic metasilicates when the polymeric substance is a phenolic resin.

Figure 1C:
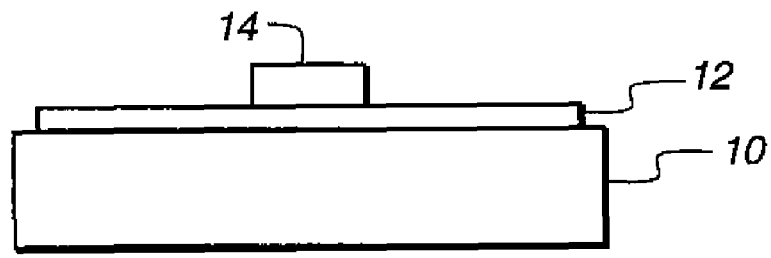
Figure 1D:
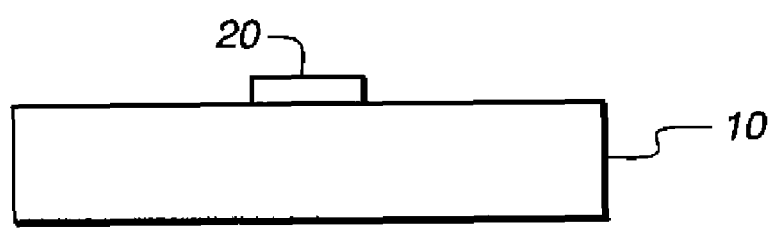

Treatment with a developer leaves a pattern of thermal resist layer 14, as shown in the cross section of FIG. 1C. The resulting pattern then serves as a mask for an etching process that leaves only the corresponding underlying material that has been protected by the patterned thermal resist material, here forming gate electrode 20 as shown in FIG. 1D (following removal of the resist pattern 14). Etching can use any of a number of suitable acids. Other etching processes, such as plasma etching, can also be used.

It is understood that these steps for fabrication of gate electrode 20 include a number of variations in terms of materials, baking temperatures, exposure times, and other parameters. Also, steps of drying, such as with nitrogen or some other inert gas, rinsing with de-ionized water or other rinse liquid, cleaning, such as with acetone or isopropyl alcohol or other material, and stabilization may need to be carried out at various points during the fabrication process, as is well known to those skilled in the component fabrication arts.

Figure 2A:
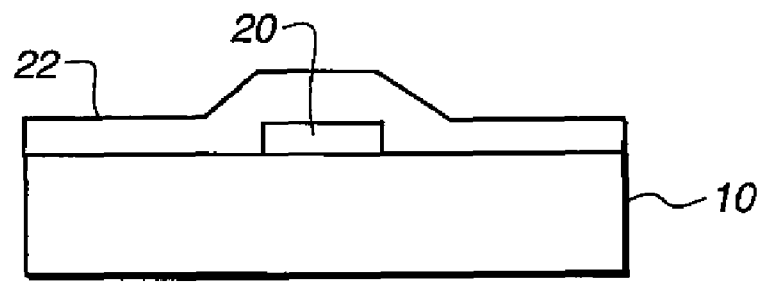
FIGS. 2A, 2B, 2C, and 2D show intermediate fabrication steps for forming dielectric and semiconductor portions of a thin-film transistor using thermal resist materials and etching processes.

(b) Gate dielectric formation. Following formation of gate electrode 20, the next step in FE-TFT fabrication forms and patterns a gate dielectric material. Referring to FIG. 2A, a gate dielectric layer 22 is deposited over the surface, including gate electrode 20. In one embodiment, $Al_2O_3$ is deposited. Deposition of dielectric layer 22 may be performed using atomic-layer deposition or other known methods.

Figure 2B:
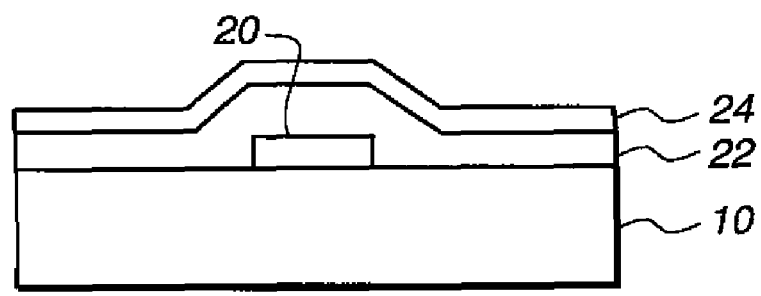

(c) Semiconductor layer formation. Following formation of gate dielectric layer 22, the next step in TFT fabrication forms and patterns a semiconductor channel. Referring to FIG. 2B, a semiconductor layer 24 is deposited atop gate dielectric layer 22. In one embodiment, the deposited semiconductor material is ZnO. Deposition of semiconductor layer 24 can be performed using atomic-layer deposition or other known methods.

(d) Semiconductor layer etch. Following deposition of semiconductor layer 24, another etching process is executed. Similar to the process described earlier with respect to gate electrode 20 formation in step (a) above, this process includes these substeps:

(i) coating of a thermal resist layer;
(ii) baking to condition the thermal resist layer;
(iii) exposure of the thermal resist to IR light;
(iv) developer treatment to remove the more soluble thermal resist and leave the resist pattern;
(v) etching to remove the unprotected semiconductor material; and
(vi) removal of the residual resist pattern.

Figure 2C:
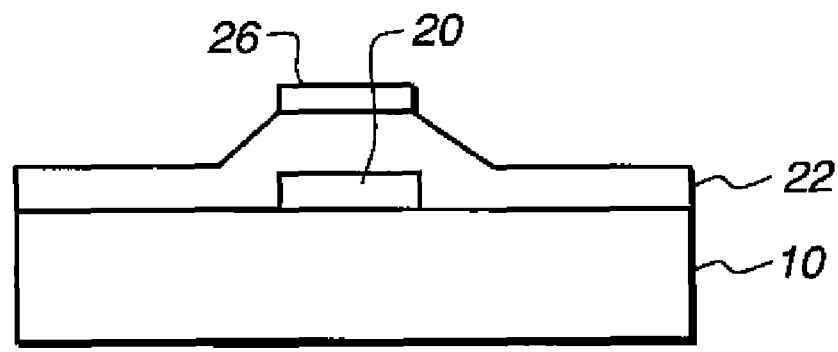

As shown in FIG. 2C, this process leaves a patterned isolated semiconductor channel 26.

Figure 2D:
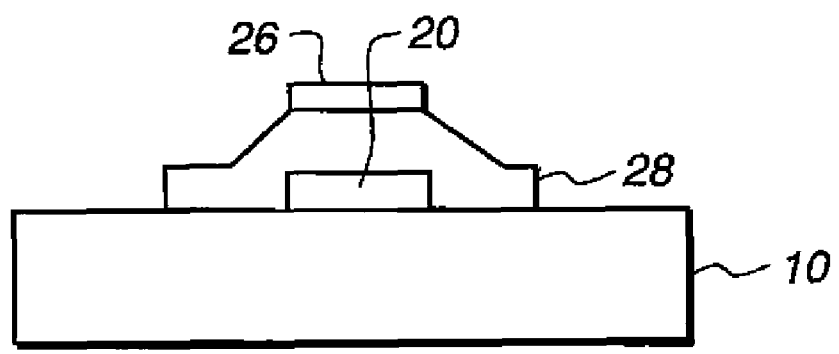

(e) Gate dielectric layer etch. Another etch process is executed in order to properly form the gate dielectric material. This process follows the general sequence listed earlier in step (d) as sub-steps (i)-(vi), with appropriate changes to suit the different materials being patterned. Referring to FIG. 2D, this process leaves a patterned dielectric 28.

At the completion of steps (a) through (e) outlined above, a partial FE-TFT has been fabricated including: substrate 10, gate electrode 20, semiconductor channel 26, and patterned dielectric 28, as shown in FIG. 2D. A different type of process is then followed in order to form electrodes for the source and drain of the FET, as described herein next.

Process Steps for Patterning of a Source and Drain Layer by Lift-Off

Lift-off methods have been previously disclosed using photoresist materials and techniques. As just one example, U.S. Pat. No. 5,391,507 entitled "Lift-Off Fabrication Method for Self-Aligned Thin Film Transistors" to Kwasnick et al. describes forming a mushroom-shaped island that aligns with an electrode structure below. Because the Kwasnick et al. '507 method uses photoresist materials, specific light-transmissive properties are required for layers of the TFT device, and special process steps are used to form the structures needed. Specifically, optical masks are used either with contact printing or with projector optics to form a pattern of UV exposure on the photoresist coating. This is not well suited for large substrates or flexible substrates where dimensional stability of the substrate and mask can be very different. Alignment of one layer to another can become problematic.

The present invention provides lift-off methods for forming patterned layers such as metal electrodes and traces using IR sensitive thermal resist. A laser scanning system has the advantage that adjustment to misalignment at a local level is possible. The computer controlled laser pulses can be delayed or advanced in real time to compensate for dimensional changes of the preceding patterned layers. In this regard IR laser writers are preferable, since high power IR systems are far less expensive than UV systems, hence allowing greater throughput and shorter exposure times. Lift-off processes are often preferable to etching processes, particularly in the cases where the preceding patterned materials are sensitive to the available etchants. For example, a layer of ZnO semiconductor is highly soluble in both acidic and basic etchants, thus greatly limiting the etching options for overlying layers. ZnO, however, is resistant to solvents such as acetone and aqueous developers, such as Kodak Goldstar Plus™. Therefore, a lift-off process such as the one in the present invention can be usefully employed to pattern, for example, metal contact layers overlying ZnO.

Figure 3A:
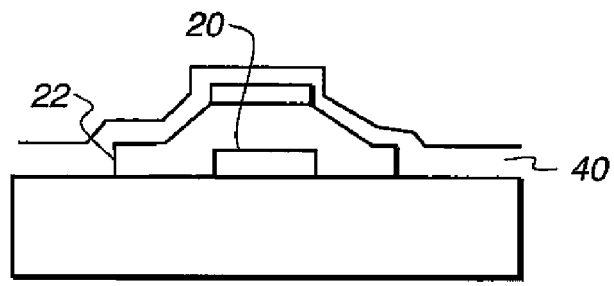
FIGS. 3A, 3B, 3C, 3D and 3E show steps of the invention in the fabrication sequence for forming electrode and trace structures using lift-off techniques.

Applicants used the following sequence illustrated in FIGS. 3A-3E:

FIG. 3A (a) Polymer layer deposition. A polymer layer 40 can be comprised of any polymer that is substantially insoluble in the solvent system and used to coat the second thermal resist layer. Insolubility is desirable to prevent mixing and allowing the formation of well-defined polymer layers. It is also desirable that the polymer layer etch at a faster rate than the thermal resist layer when subjected to the isotropic etch step used to remove the first polymer from exposed regions and form undercut structures at the edges of an image. The cyanoacrylate polymers utilized in these examples have many advantageous properties for use in the polymer layer, including a relatively low decomposition temperature (typically about 250 C), excellent adhesion to glass and other common substrates and compatibility with small molecules such as absorber dyes.

The useful cyanoacrylate polymers include homopolymers of a single cyanoacrylate monomer such as poly (methyl-2-cyanoacrylate) or poly(ethy-2-cyanoacrylate), copolymers of two different cyanoacrylate monomers such as poly(methyl-2cyanoacrylate-co-ethyl-2-cyanoacrylate) and interpolymers of three or more cyanoacrylate monomers such as poly(methyl-2cyanoacrylate-co-ethyl-2-cyanoacrylate-co-propyl-2- cyanoacrylate). In addition poly(alkoxyalkyl cyanoacrylates) such as (methoxyethyl-2-cyanoacrylate) can be used.

A polymer layer 40 is applied and dried. Polycyanoacrylate (PCA) has been used for ablation formulas when combined with IR absorber dye. In this application, PCA can be used without IR dye (although some could be added to enhance the thermal resist sensitivity). In one exemplary embodiment, PCA is used to form the polymer layer that is not removed in the development step (described subsequently), but is removed using $O_2$ plasma etching and etches at a faster rate during plasma etching than does the thermal resist material. Thus, PCA provides a useful layer for forming overhangs when used in the sequence described here.

Figure 3B:
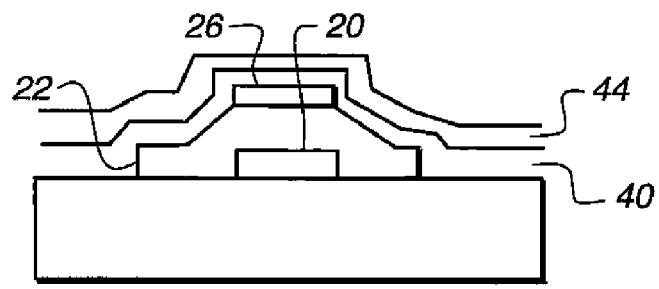

(b) Thermal resist deposition. As illustrated in FIG. 3B, a layer of thermal resist material 44 is applied over polymer layer 40 and heat-hardened.

Figure 3C:
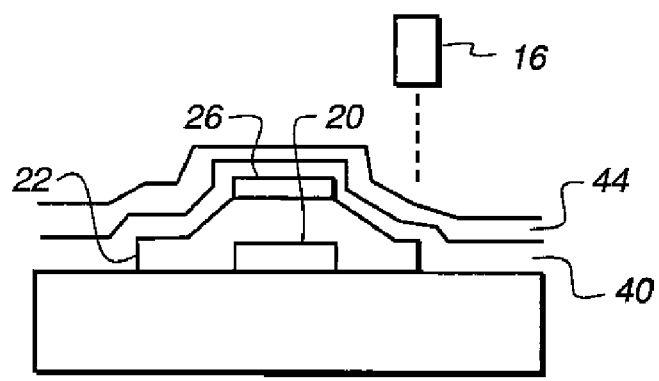

(c) Pattern exposure. As illustrated in FIG. 3C, thermal resist layer 44 is then exposed to IR radiation from laser 16 to selectively render the thermal resist soluble in developer.

(d) Development. Exposed thermal resist is selectively removed in a developer solution to form a thermal resist pattern.

Figure 3D:
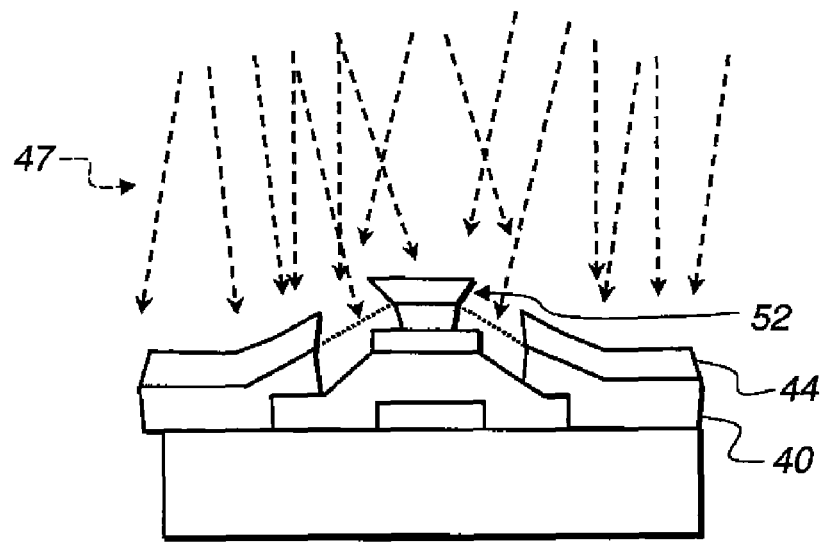

(e) Removing the polymer. $O_2$ plasma, an isotropic etch, 47, is applied to selectively remove portions of the polymer layer, 40, in exposed areas and in narrow perimeter regions under the edges of the remaining thermal resist pattern exposed in step (c) creating thermal resist overhangs 52 as illustrated in FIG. 3D.

As noted earlier, the polymer layer 40 etches at a faster rate than does thermal resist layer 44, thus forming the thermal resist overhangs 52.

Figure 3E:
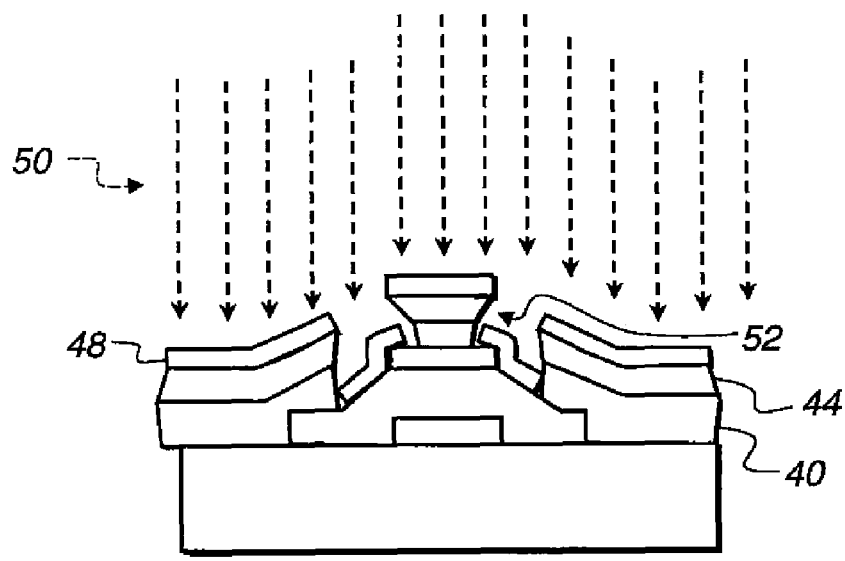

(f) Metal deposition. A metal layer 48 is then deposited on the surface. Metal deposition can be employed by vacuum deposit, or vapor deposition, or other known methods can be used. An anisotropic deposition method is preferred as illustrated in FIG. 3E, where deposition direction 50, for metal layer 40, is substantially unidirectional, allowing effective shadowing by the thermal resist overhang 52 in accordance with the present invention.

(g) Material removal. An acetone bath with sonication is used to remove polymer, thermal resist and overlying metal material in the lift-off step to leave the complete TFT, 60 including substrate 10, gate electrode 20; patterned gate dielectric 28; patterned semiconductor, 26; and electrodes 30 and 32 as illustrated in FIG. 4.

(h) Cleaning. A further cleaning step may be used to apply acetone isopropyl alcohol, $O_2$ plasma treatment or other substance to clean the surface.

There are a number of options for forming overhang 52. One alternative method uses a single layer resist material and hardens a portion of the upper surface. With the thermal resist material described earlier, a developability inhibiting material such as a chlorobenzene or a similar solvent material can be applied to modify surface properties, without degrading the underlying material a few microns below the surface, depending on the amount of time during which the thermal resist material is exposed to the solvent. The treated area of the thermal resist material proves more resilient than does the untreated underlying area to etching materials and processes. Thus, this method forms a "mesa" structure, in which the upper surface overhangs lower portions as shown in FIGS. 3D and 3E. Chlorobenzene has been usefully employed with photoresists and by the inventors using thermal resist to form patterned metal traces. With the current thermal resists, however, bridging of metal across thin gap features was observed and it was deemed desirable to provide a more reliable lift-off process for patterning fine features.

Figure 4:
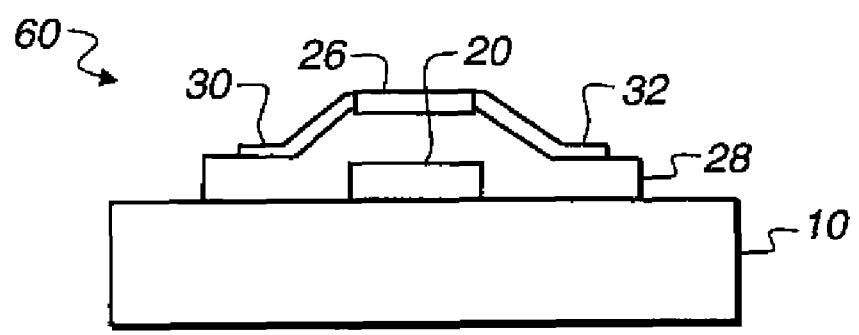
FIG. 4 shows a thin-film transistor fabricated using the sequence described with reference to FIGS. 1A through 3E.

FIG. 4 shows an exemplary thin-film transistor 60 fabricated using the sequence described with reference to FIGS. 1A through 3D. Accordingly, thin-film transistor 60 includes substrate 10, gate electrode 20 built upon substrate 10; patterned gate dielectric 28 built upon gate electrode 20; and electrodes 30 and 32 built upon patterned gate dielectric layer 28 and semiconductor channel 26.

Lift-Off Working Example of Forming a Patterned Source/Drain Layer in Accordance with the Present Invention.

The inventors formed source and drain electrodes on a partially completed FE-TFT on a glass substrate using the following process steps:

To prepare the polymer layer coating solution for the examples described below, 7.5 g of poly (methyl-2-cyanoacrylate co-ethyl-2cyanoacrylate) in a 50:50 blend of acetonitrile and cyclopentanone, and 0.5 g of a 5% solution of surfactant Fhlorad™ FC-431, a perfluorinated alkyl sulfonamidoalkyl ester surfactant (3M Corp.) were combined and passed through a 0.2 μm filter.

The thermal resist material was formulated substantially as described in PCT International Application No. WO 97/39894, cited earlier and incorporated herein in its entirety. To prepare 100 g of thermal resist coating solution, stock solutions comprised of 84.5 g of 20% wt./wt. solution of Novalak PD494, 6.76 g of 3% Basonyl Violet 610, 8.45 g of 3% solution of IR dye

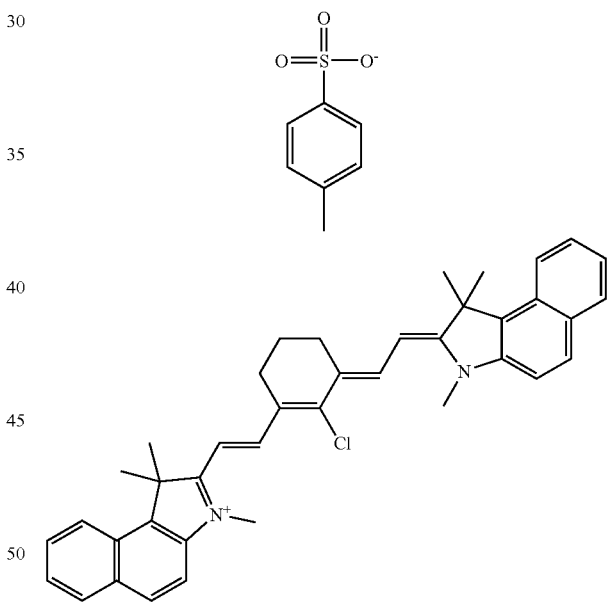

and 0.3 g of 10% surfactant BYK307, a polyethoxylated dimethylpolysiloxane copolymer as supplied by BYK Chemie, Wallingford, Conn., in 80% 1-methoxy-2-propanol and 20% methyl ethyl ketone were combined and passed through a 0.2 μm filter.

A 1.1 mm glass substrate was pre-patterned with a gate layer, gate dielectric layer and a semiconductor layer as described earlier above.

1. The polymer layer solution of (methyl-2-cyanoacrylate co-ethyl-2cyanoacrylate) was spin coated at 5000 rpm for 60 seconds and dried at 160 degrees C for 20 seconds.
2. The thermal resist solution was spin coated at 3000 rpm for 60 seconds and heat set at 160 degrees C for 10 minutes.

3. The sample was exposed with approximately 500 mJ/cm², image wise, using an infrared diode laser writer with an array of 5 µm spots at 810 nm.
4. The exposed sample was developed with Kodak Goldstar Plus™ for 60 seconds, rinsed in de-ionized water for 30 seconds and dried with nitrogen.
5. The developed sample was plasma etched with 200 W at 0.3 Torr of $O_2$ for 2 minutes.
6. Aluminum metal was vacuum deposited without masking to a layer thickness of 600 Å.
7. Lift-off (removal) of Al, polymer and thermal resist from background areas was achieved in an acetone bath with sonication for 5-7 minutes.
10. The sample was cleaned with a fresh acetone rinse followed by an isopropyl alcohol rinse and dried with nitrogen.

The above steps were performed at room temperature (nominal 20 degrees C), except where otherwise noted. Micrographs of the resulting images were found to be free of jagged edges and free of bridging between closely spaced traces. The resulting electrodes and other structures were judged to be highly satisfactory in both appearance and performance.

The invention has been described in detail with particular reference to certain preferred embodiments thereof, but it will be understood that variations and modifications can be effected within the spirit and scope of the invention.

PARTS LIST

| | |
|---|---|
| 10 | Substrate |
| 12 | Metal layer |
| 14 | Thermal resist layer |
| 16 | Laser |
| 20 | Gate electrode |
| 22 | Gate dielectric layer |
| 24 | Semiconductor layer |
| 26 | Semiconductor channel |
| 28 | Patterned dielectric |
| 30, 32 | Electrode |
| 40 | Polymer layer |
| 44 | Thermal resist layer |
| 47 | Isotropic etch |
| 48 | Metal layer |
| 49 | Plasma Etching |
| 50 | Deposition direction |
| 52 | Thermal Resist Overhang |
| 60 | Transistor |
| 66, 68 | Trace |
| 70 | Crossover |
| 72 | Cell |
| 74 | Wall |
| 76 | Layer |
| 78 | Substrate |

The invention claimed is:

1. A method for producing a patterned material for electronic or photonic circuits, comprising:
   providing a substrate;
   coating the substrate with a polymer layer;
   coating a thermal resist solution over the polymer layer to form a thermal resist layer, wherein the polymer layer is substantially immiscible in the thermal resist solution;
   exposing selective areas of the thermal resist layer, corresponding to the desired image pattern using infrared light;
   removing portions of the thermal resist layer corresponding to a desired image pattern using developer;
   removing the polymer layer where the thermal resist layer has been previously removed and undercutting a portion of the remaining thermal resist layer by an etching process wherein the step of removing the polymer is accomplished using a plasma etch;
   depositing a metal semiconductor or insulator material using a substantially anisotropic process;
   removing the remaining thermal resist layer and any overlying material with a solvent for the polymer or thermal resist layers leaving the material in a desired pattern; and
   wherein the polymer layer includes infrared absorbing material.

2. The method claimed in claim 1, wherein the patterned material includes multiple layers.

3. The method claimed in claim 1, wherein the patterned material is a semiconductor, an insulator, or a metal.

4. The method claimed in claim 1, wherein the step of depositing the material is by sputtering, thermal-evaporation, e-beam evaporation, or laser ablation transfer.

5. The method claimed in claim 1, wherein the polymer layer is polycyanoacrylate (PCA).

6. The method claimed in claim 1, wherein the thermal resist contains an infrared absorbing material.

7. The method claimed in claim 1, wherein the thermal resist is heated before exposure for a time and temperature sufficient to render it insoluble in the developer.

8. The method claimed in claim 1, wherein the thermal resist is a developer soluble polymer.

9. The method claimed in claim 1, wherein the thermal resist comprises a phenolic resin.

10. The method claimed in claim 1, wherein the aqueous developer is an aqueous quarternary ammonium containing basic solution.

11. The method claimed in claim 1, wherein the step of removing the remaining thermal resist layer is accomplished using acetone.

12. The method claimed in claim 1, further comprising the step of heating the substrate, after coating the thermal resist and prior to infrared exposure.

13. The method claimed in claim 1, wherein the thermal resist is positive working.

14. The method claimed in claim 1, wherein the thermal resist is negative working.

15. A method for producing a patterned material for electronic or photonic circuits, comprising the steps of:
   providing a substrate;
   coating the substrate with a polymer layer;
   coating a thermal resist solution over the polymer layer to form a thermal resist layer, wherein the polymer layer is substantially immiscible in the thermal resist solution;
   exposing predetermined areas of the thermal resist layer, corresponding to a desired image pattern, using infrared light;
   removing portions of the thermal resist layer corresponding to a desired image pattern, using a developer;
   removing the polymer layer where the thermal resist layer has been previously removed and undercutting a portion of the remaining thermal resist layer by an etching process wherein the step of removing the polymer is accomplished using a plasma etch;
   depositing a material using a substantially anisotropic process;
   removing the remaining thermal resist layer and any overlying material with a solvent for the polymer or thermal resist layers leaving the material in a desired pattern; and
   wherein the polymer layer includes infrared absorbing material.

* * * * *